United States Patent [19]

Zevgolis et al.

[11] 4,237,372
[45] Dec. 2, 1980

[54] SCOREKEEPING DEVICE FOR TENNIS AND SIMILAR GAMES

[75] Inventors: Victoria H. Zevgolis, Hopewell, Va.; Harry E. Kitchen, Gaithersburg, Md.

[73] Assignee: Sportsonic, Inc., Alexandria, Va.

[21] Appl. No.: 915,463

[22] Filed: Jun. 14, 1978

[51] Int. Cl.³ .................. G08B 23/00; H03K 21/22
[52] U.S. Cl. ....................... 235/92 GA; 235/92 CP; 340/323 R
[58] Field of Search ............ 235/92 GA, 92 CP; 340/323 R; 273/29 R, 1 ES

[56] References Cited

U.S. PATENT DOCUMENTS

| | | | |
|---|---|---|---|
| 4,097,855 | 6/1978 | Salvo | 235/92 GA |
| 4,119,838 | 10/1978 | Genuit | 235/92 GA |

*Primary Examiner*—Joseph M. Thesz
*Attorney, Agent, or Firm*—Harry E. Kitchen

[57] ABSTRACT

An electronic device for calculating, storing and indicating the scores and related information for a game of tennis is described. The circuit provides for the special requirements of tennis and similar games by recognizing the existence of an endgame condition such as "deuce" in tennis and registering each new score as a function of the previous score and the point most recently won. Both up-down counters and decoders using non-volatile memory, including "read-only memory" (ROM) are disclosed for the point-calculation function, and a display encoder is described which efficiently provides for the display of alphanumeric scores, including "deuce" and "advantage" conditions. The invention includes features for indicating court change requirements, elapsed time, time of day, and display emphasis when a game is won. All score calculations are subject to a clear-entry feature to rectify operating error.

10 Claims, 9 Drawing Figures

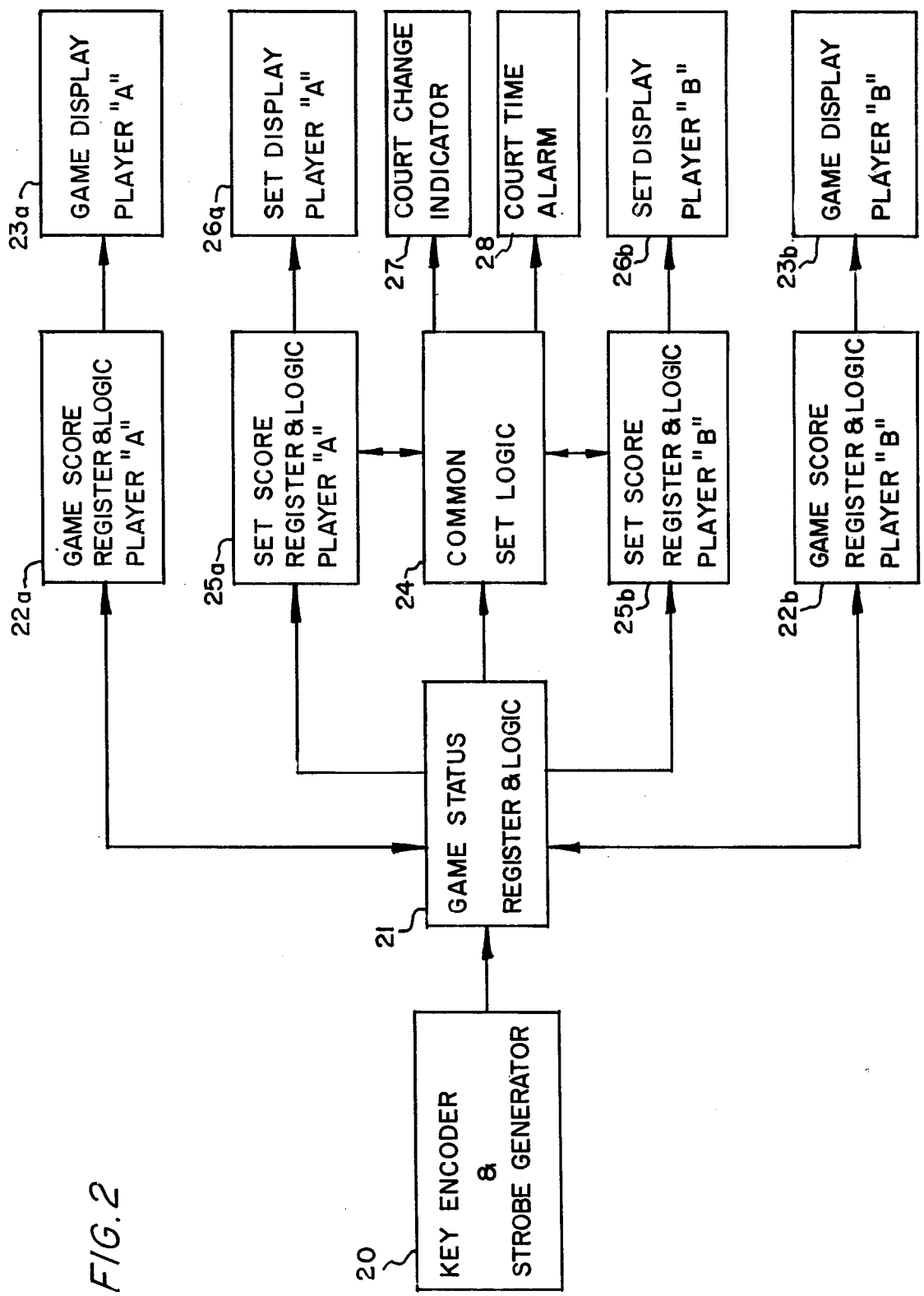

SCOREKEEPING DEVICE FOR TENNIS AND SIMILAR GAMES

BACKGROUND OF THE INVENTION

1. Field of the Invention

The present invention relates to a device for calculating, storing and displaying the score of a competitive sport or game that is similar to tennis.

2. Description of the Prior Art

In any competitive game, it is of great value to keep a reliable record of scores as the game progresses. In games that are generally regarded as spectator sports, it is often worthwhile for owners of the playing facilities to invest in large scoreboards so that the results and timing of a game are immediately visible to spectators, players and officials alike. But many sports are played only in the presence of the players, and costly scoreboard arrangements are not economically feasible.

Some games, such as tennis, lawn tennis, table tennis and volleyball have scoring systems that are not as straightforward as simply counting a point score until a particular value is reached. In each of the games cited, there is at some point in the game a condition in which a player must achieve a certain number of points greater than those of his opponent in order to win and terminate the game.

The two conditions described above indicate a need for a device which may be used without costly construction, without hindering the physical activities of the players, and with the ability to construct a score sequence that goes beyond ordinary point counting.

U.S. Pat. No. 3,254,433 to Saile and Saile describes a partial but useful approach to these problems, wherein a scoring device mountable on the fence of a tennis court contains an actuating mechanism on its front panel, which indexes a score displaying mechanism whenever a tennis ball is thrown at it. This allows the scores to be displayed without requiring either player to carry a bulky scorekeeping device, and without participation by any third party. It does not, however, teach means for identifying and calculating the existence of a "deuce" or "advantage" condition as is frequent in tennis; such a condition may be displayed, but requires the player to strike the target panel more than once to position the display device to the proper score.

A comprehensive solution to the needs of scoring a game such as tennis would necessarily involve a device that may be adapted for either public display (as in a scoreboard), or which may be small and light enough for the player to wear without discomfort or restriction of his playing skill. It should also respond to any new point scored in tennis or similar games without requiring the player to divert his consciousness from the actual playing of the game, and hence should be fully automatic in its calculation of a new score, as well as in its ability to identify the winning of a game and the subsequent increase in a player's set score.

In addition to the scoring of games, there are other features which are incidental to the playing of a game and which would render such a device much more useful, explicitly to the tennis player. Some games including tennis require the exchange of sides of the playing court after a certain number of games are played, to insure fairness in the presence of local playing conditions such as sunlight or wind. Accordingly, it is an object of the present invention to provide a court change indication based on a particular class of scoring states.

When several players must share the same facilities, local rules frequently provide for a particular time limit for playing. Accordingly, it is an object of the present invention to provide an indication of a preset elapsed time, and to provide for the possible indication of time of day or elapsed time. U.S. Pat. Nos. 3,928,960 and 3,803,834, both to Reese, disclose conventional arithmetic calculators in combination with a time-of-day indication, but do not teach the application of game scoring in their respective calculator functions.

SUMMARY OF THE INVENTION

The present invention is applied to an electronic calculator for scoring of tennis and similar games in which winning of a game requires one opponent's score to be a specific number of points greater than the score of the other opponent. To avoid the use of point-counting registers of infinite or impractically large numeric capacity, the present invention allows either score to reach a maximum value, and thereafter operates to decrement the opponent's score until a condition is reached in which the winning of a new point results in the winning of a game. Means are provided to clear an incorrect entry and return to the previous, valid score values. For games in which the achievement of a particular set of point values changes the method of declaring scores, as for example the use of "deuce" or "advantage" scores in tennis, display means and display encoder circuitry are provided to recognize such an endgame condition and to display the scores as required.

Additional means are provided to count and display the number of games won for each opponent, to derive and display a court-change indication based on the number of games played, and to derive and indicate the passage of a particular time limit, as is often required when players are using shared facilities.

The present invention makes use of logic circuitry which may be packaged as medium—or large-scale integrated circuits, so that it may be small and light enough for the players to wear on a belt, or in a configuration similar to a wristwatch, or in combination with an electronic wristwatch with shared or separate displays and controls.

These and other features, objects and advantages of the present invention will become apparent to those skilled in the art from a consideration of the following detailed description of a preferred embodiment of the invention, taken in conjunction with the appended drawings, in which:

BRIEF DESCRIPTION OF THE DRAWINGS

FIG. 2 is a block diagram showing a preferred partitioning of circuit modules within the present invention.

DESCRIPTION OF THE PREFERRED EMBODIMENT

Figure 1:
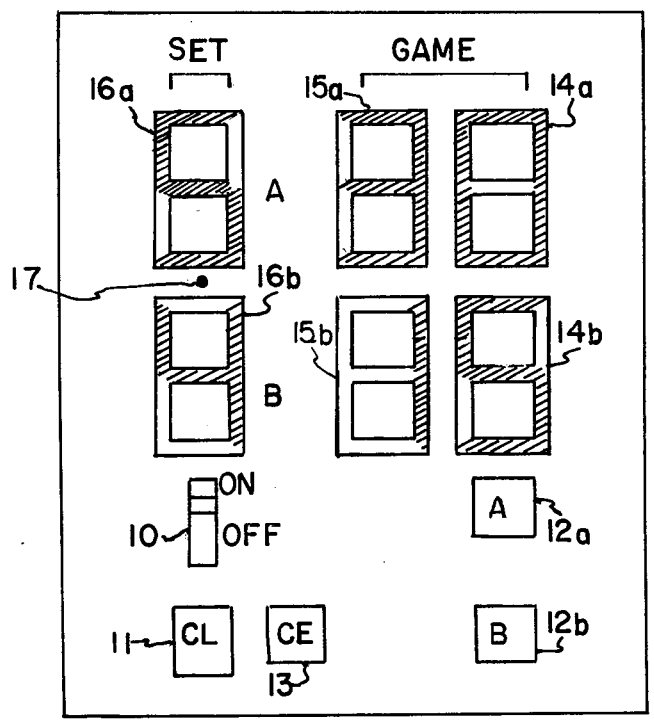
FIG. 1 is a drawing of a control and display panel for actuation of the present invention and for display of the results.

Referring first to FIG. 1, there is shown one of many possible layouts of a control and display panel for activating the present invention, and for viewing the results of its calculations. A switch 10 applies power from a suitable storage cell or similar power source. A CLEAR key 11 causes all scores to be effectively set to zero, and all internal status registers to be reset to an appropriate inital value. A pair of point-entry keys 12 causes the score of each of two players to be incremented, and a CLEAR ENTRY key 13 reverses the process in the event of an incorrect entry by the user.

Game displays 14 and 15 show the current value of each player's score in a format that is suitable for the game being played. So that the calculator may be capable of accumulating the number of individual games won by each player, there is included one set score display 16 for each player. The set display 16 may additionally be capable of blinking for a period of time after a new game has been won, as an auxiliary means for indicating which of the two players has won the most recently completed game. A court change indicator 17 may be included to indicate that the players must change courts, or perform another action which is based on alternate games completed. In tennis, the court change indicator is configured to light whenever the sum of the set scores is an odd number, i.e., after every other game. An additional indicator, not shown in FIG. 1, may be a COURT TIME ALARM, which may be a visible indicator or an audible alarm, and whose purpose is to remind the players that a specified period of time has passed since their period of play began. In tennis, for example, a one-hour time limit is typical for the use of shared courts.

As a means to facilitate the use and interpretation of results of scoring, both the data entry keys 12 and the score indicators 15 and 16 may be compatibly color coded so that the user has an immediate and clear idea of which keys to press and of which scores are associated with which keys.

Referring now to FIG. 2, there is shown the perferred embodiment of the present invention, in the form of a block diagram. It will be understood that lines representing signal flow between and among the different modules is for illustrative purposes, and that a wide variety of partitioning modes is possible, within the constraints of the matter disclosed herein. A KEY ENCODER AND STROBE GENERATOR 20 contains the function keys 11, 12 and 13 of FIG. 1, and additionally contains storage registers, logic and strobe-generation circuitry to provide appropriate command signals to the remainder of the circuits and displays. A GAME STATUS REGISTER AND LOGIC 21 contains registers and logic that are commonly required to calculate and display the game scores of both players. GAME SCORE REGISTERS AND LOGIC 22 are duplicated identically for each player and contain a counting register appropriate to the game being scored, in conjunction with logic to cause each player's score to be changed as each successive point is scored, or as a scored point is withdrawn via the CLEAR ENTRY key 13 of FIG. 1. Because it is advisable from the standpoint of keeping circuitry to a practical minimum, certain functions are created in one of the GAME SCORE REGISTERS AND LOGIC 22, and used as an input in the opponent's corresponding logic. Hence, the data flow is shown as running in both directions between the GAME STATUS REGISTER 21 and the GAME SCORE REGISTER 22. Based on the logical signals derived in 22 and elsewhere within the calculator, a GAME ENCODER AND DISPLAY 23 encodes the resulting score into display format for each player and presents it on a pair of conventional seven-segment display devices shown as 14 and 15 in FIG. 1.

The essential functions of both the game and set score calculating modules are twofold: to store a digital representation of the current score in each case, and to replace that score with a new one on command, based on a logical combination of the current score and the input keys being actuated. Because there are many conventions associated with logic design, and many design choices that may be passed on economy or availability of components but are otherwise arbitrary, it will be understood that a variety of different combinations of data registers and logic elements may be constructed without departing from the inventive concept disclosed herein.

Figure 3:
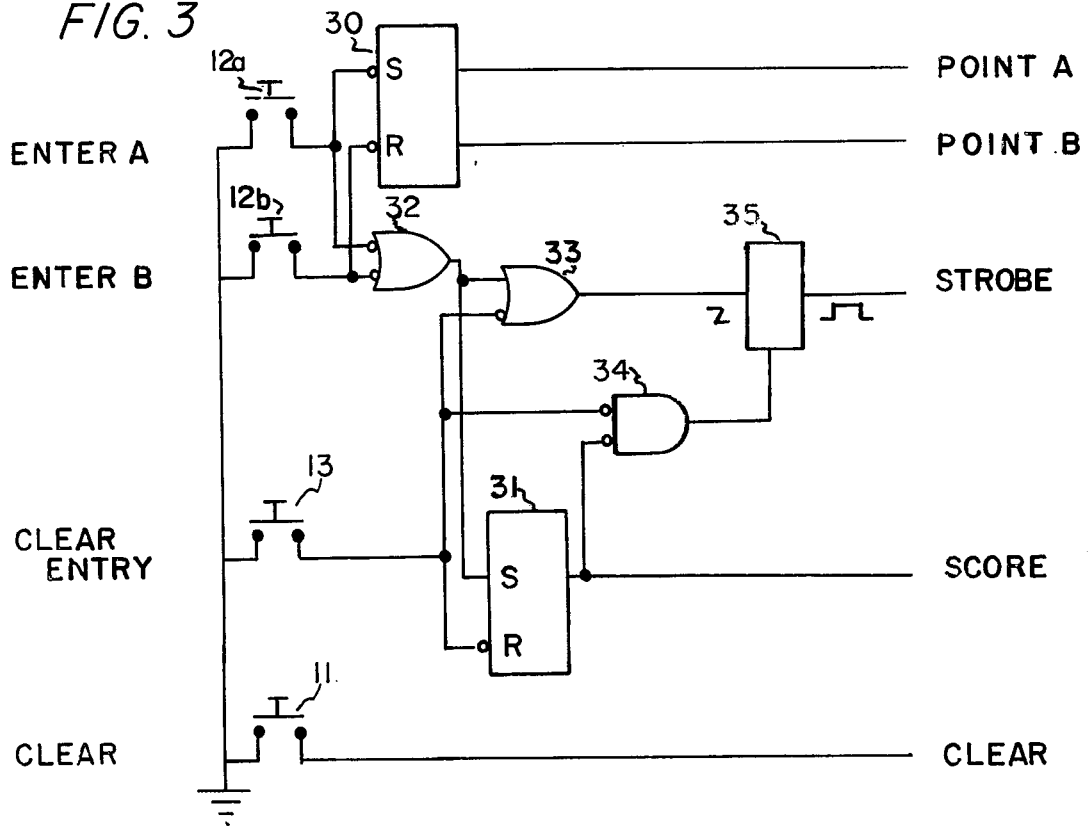
FIG. 3 is a logic diagram of data entry keys and associated circuitry of the preferred embodiment; and associated circuitry of the preferred embodiment.

Referring now to FIG. 3, there is shown preferred means for decoding keystrokes and generating strobe and control signals to actuate the remainder of the circuitry of the invention. The key switches 11, 12 and 13 are drawn as the electrical equivalent of those of FIG. 1, and in the preferred embodiment will create a low logic level whenever each key is depressed. It will be recalled that the actual polarities of these resultant logic signals, as well as all the remaining signals disclosed herein, are totally arbitrary and may be exchanged at will, provided that they remain logically compatible with the signals which will be used in combination with them.

Upon depression of the ENTER A switch 12a or the ENTER B switch 12b, a register 30, also known as a flip-flop or a bistable latch, will be set to a state corresponding to output signals POINT A or POINT B, respectively, as an indication of which player is to receive the new point. At approximately the same time, an OR gate 32 generates a pulse meaning that either one of the ENTER switches 12 has been depressed. This pulse sets another register 31, as an indication that the last action was a SCORE as opposed to a CLEAR ENTRY condition. If either a SCORE or a CLEAR ENTRY action has taken place, a monostable multivibrator or triggering device 35 generates a pulse called STROBE upon release of the key in question. To prevent multiple triggering of the CLEAR ENTRY function, it is desirable to provide an INHIBIT function to the triggering device 35, whose logic state is derived from the CLEAR ENTRY signal and the logical inverse of the SCORE signal, as combined in the AND gate 34.

It will be observed that all references to AND gates and OR gates will be construed to include corresponding inverted functions such as NAND and NOR, and that a small circle drawn at an input or output denotes a logic level inversion that is appropriate to the signals being acted upon within the preferred embodiment.

Finally, depression of the CLEAR key 11 will generate a pulse of appropriate level to reset registers within the invention at the start of operation. This function may be performed automatically when power is first applied, as is common and well known in the art. As is also common, it is desirable to provide "pull-up" resistors to each keyswitch to firmly establish its inactive electrical state and prevent false triggering due to electrical noise. Although not shown on the drawings, each active circuit requires the application of electrical power, and grounds for power and signal.

Figure 4:
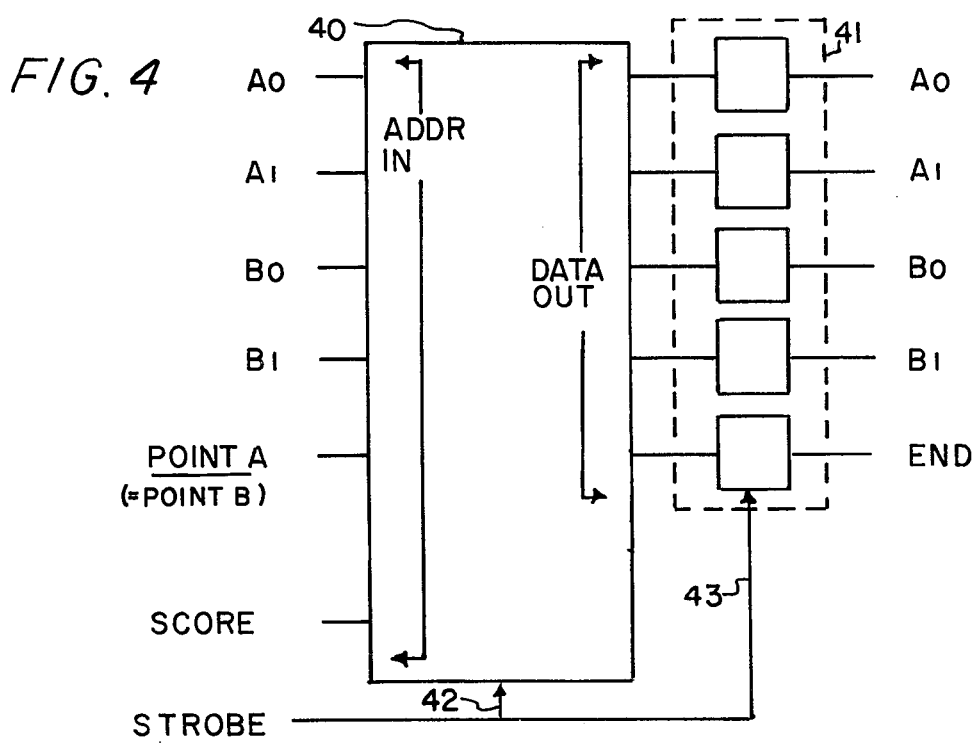
FIG. 4 is a block diagram of memory means for deriving and storing score results.

Recalling that two of the principal functions of the invention are to store each new score as it is calculated, and to derive the next score based on a logical combination of the previous score and the keyswitch last actuated, FIG. 4 illustrates one method for accomplishing these objectives. A data register or LATCH 41 is used to contain a representation of the last score derived.

In the preferred embodiment, as applied to the game of tennis, the scores of two players are contained in two two-bit registers (A0, A1) and (B0, B1), where A and B refer to the respective players and the digits 0 and 1 refer to the lower-order and high-order binary digits respectively. The meaning of the digits with respect to ordinary scoring is simply a binary count of the points received; thus in tennis, register (A0, A1) would initially contain score representations according to the following table:

| TENNIS SCORE | A1 | A0 |
|---|---|---|
| 0 (LOVE) | 0 | 0 |
| 15 | 0 | 1 |
| 30 | 1 | 0 |
| 40 | 1 | 1 |

In tennis and many other sports, however, there is a condition within a game where the numerical scoring as illustrated above is abandoned, and the scorekeepers switch to an alternate method based on points-ahead rather than the absolute number of points scored. The convention in tennis, for example, is to declare the score DEUCE or DEUCE GAME whenever the score is 40—40, and every time thereafter that the players have an identical number of points. When one player has a one-point lead, the score is declared ADVANTAGE or AD for that player, and a two-point lead constitutes the winning of GAME.

To account for such a condition within the present invention, a single register has been provided within the LATCH 41 of FIG. 4, and its output state is called END. Thus for a complete game of tennis, all the scores possible may be represented by the following table:

| TENNIS SCORE | A1 | A0 | END |
|---|---|---|---|
| 0(LOVE) | 0 | 0 | 0 |
| 15 | 0 | 1 | 0 |
| 30 | 1 | 0 | 0 |
| 40(not DEUCE) | 1 | 1 | 0 |
| DEUCE | 1 | 1 | 1 |
| AD (player A) | 1 | 1 | 1 |
| AD (player B) | 1 | 0 | 1 |

All that is required to calculate a subsequent score is to decode the combined logic states of the registers within the LATCH 41, comprising A0, A1, B0 and B1, in combination with the input logic states POINT A (which is always the logical inverse of POINT B) and whether or not the SCORE condition (as opposed to the CLEAR ENTRY condition) is being requested by the circuitry of FIG. 3. One method of accomplishing the decoding function is via the use of a NON-VOLATILE MEMORY 40, which may be any of a wide variety of memory products including a read-only memory or any form of magnetic core provided with non-destructive readout or a means for refreshing its contents after reading. The address of a particular memory location comprises the logic states of A0, A1, B0, B1, POINT A and SCORE presented in any order, and the contents of the memory location will be preset with the appropriate values of A0, A1, B0 and B1. The actual contents of such a memory table are not presented here because of their length, although one skilled in the art could easily construct such a table and pre-program the NON-VOLATILE MEMORY 40 to select new values for each score condition.

Because of its utility in interpreting the resulting scores for display purposes, an additional output function END is shown in FIG. 4. It is not absolutely necessary to include this function, although it is preferable to render the required logic circuitry minimum that it be included in the outputs presented to LATCH 41. By reference to the latter of the two score tables above, it is observed that a DEUCE is represented by a TRUE bit in both registers A0 and A1. The same condition could just as effectively be represented by a TRUE in the A1 register and a FALSE in the A0 register for DEUCE, provided that A registers and the B registers both contained the same score, and means were provided to inform the display circuitry that the score being represented were a DEUCE as opposed to 30-30 or 40-40. The END logic state serves this function for use in display coding, and in the preferred embodiment it is also used to force the internal representation of a DEUCE score to 11 (binary) rather than 10, for purposes of reducing logic required to decode the score. Thus the END option is included as a latched output in FIG. 4.

Still with reference to FIG. 4, the STROBE input generated within the circuitry of FIG. 3 or its functional equivalent is used to cause the MEMORY 40 to retrieve each new score, and the LATCH 41 to preserve the retrieved output. It will be understood that memory products with built-in latches for output are functionally and structurally equivalent to the combination of FIG. 4.

Figure 5:
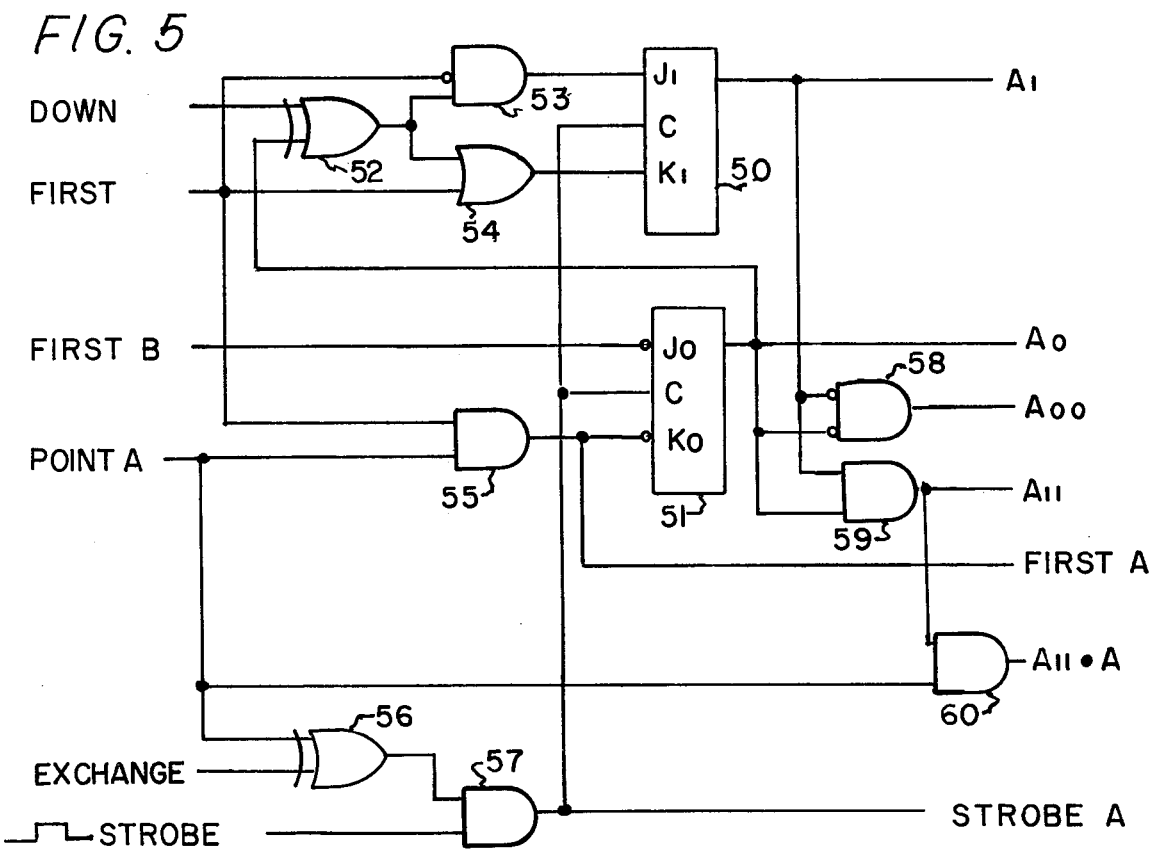
FIG. 5 is a logic diagram of counter means for deriving and storing score results.
Figure 6:
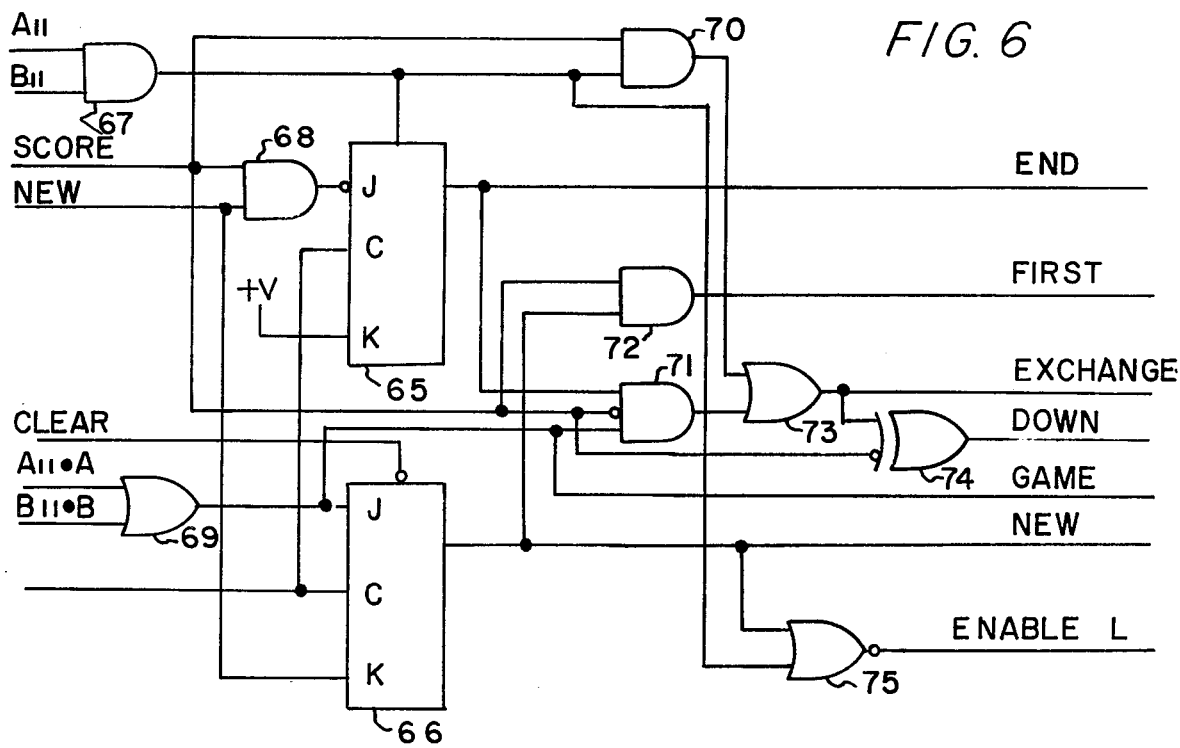
FIG. 6 is a logic diagram for circuitry common to the scoring for two players for use with the counter means of FIG. 5.

Another embodiment of the score register and score encoder combination of the present invention is disclosed in FIGS. 5 and 6. Referring now to FIG. 5, a pair of registers 50 and 51 are shown as containing the score bits A1 and A0, respectively, it being understood that the entirety of the circuit in FIG. 15 is replicated for players A and B, identically. In the circuit of FIG. 5, the registers themseleves contain decoding inputs J and K and are commonly known as J-K flip-flops. Whenever a strobe is applied to the clocking input C of either, the resulting output state will transition to a new value depending upon the initial states of J and K, according to the following table:

| INITIAL | VALUES | OUTPUT |
|---|---|---|
| J | K | Q |
| 0 | 0 | Same as prior output |
| 0 | 1 | 0 |

-continued

| INITIAL VALUES | | OUTPUT |
|---|---|---|
| J | K | Q |
| 1 | 0 | 1 |
| 1 | 1 | Opposite prior output |

It will be shown that the circuit of FIG. 5 can be made to function as an up-down counter which may be loaded to an initial state 01 (binary) or 00, to satisfy the scorekeeping requirements of the present invention. Whenever the STROBE is received, the AND gate 57 will allow that strobe to pass to registers 50 and 51 if the output of the EXCLUSIVE-OR gate 56 is high. The latter condition will be true whenever the POINT A input is TRUE, unless the EXCHANGE STROBES input is TRUE, in which case the gate 57 will pass the strobe only if POINT B (the inverse of POINT A) is in the TRUE state. As an example of the need to exchange the strobes in this fashion, it will be recalled that following a DEUCE score, it is desirable upon the winning of a point by player B to decrease player A's score register to binary 10 rather than increment player B's register, which would be interpreted by the display and set-score circuitry to denote the winning of a game. Whenever registers 50 and 51 receive a strobe from gate 57, they will assume a new state based on their respective J and K inputs. Referring to the truth table shown above, the registers 50 and 51 will increment their binary count under normal circumstances. With J0 and K0 both TRUE, the lower-order bit A0 will always change states, as it should for either an up—or down-count. If the special-condition inputs DOWN and FIRST are both in the FALSE state as they will be for usual operation, the value of J1 and K1 will both assume the value of A0 after their passage through gates 52, 53 and 54. This will mean that when the prior state of A0 is TRUE, A1 will change states, and when the prior state of A0 is FALSE, then A1 will not change states. Thus the binary up-count 00, 01, 10, 11, 00 . . . etc. is satisfied and the circuit functions as an up-counter.

By presentation of the DOWN input signal, the sense of A0 is inverted as it passes through the EXCLUSIVE-OR gate 52, the binary sequence 11, 10, 01, 00, 11 . . . is satisfied and the circuit functions as a down-counter.

Under special circumstances, the register comprising 50 and 51 will need to be loaded to an initial value. After a game has been won by one of the players, and when the next point has been scored, it is desirable to set the score of the winner of that point to binary 01, and that of the loser to binary 00. To accomplish this, the higher-order bits A1 and B1 are both set to zero by loading the J1 and K1 inputs of each register with 0 and 1 respectively. Existence of a TRUE state on input FIRST will force J1 to FALSE via the AND gate 53, and will force K1 to TRUE via the OR gate 54. To load the proper initial score into the lower-order bit of each register, the winner's J0 input will be FALSE due to AND gate 55 in the opponent's register. Consequently, the J-K inputs represented by binary 10 will render the winner's low-order register 1, and, by symmetry, the loser's corresponding register 0.

Although the embodiment shown uses J-K flip-flops as the register and counting element, those skilled in the art will observe that there are other choices of register element. For example, a device commonly known as a D flip-flop will assume its input state upon receipt of a strobe, and it is easy for those skilled in the art to configure that logic gates to derive an appropriate D input rather than two J-K inputs for each one-bit register.

In addition to the score-calculating functions, certain outputs of each individual rgeister are useful for display and other functions to be described below. Thus the AND gate 58 goes TRUE whenever both bits of the register are 0, and the AND gate 59 whenever they are both 1, creating outputs A00 and A11, respectively. The AND combination of A11 and POINT A is derived by gate 60 for use in detecting the winning of a new game.

Referring now to FIG. 6, there is shown a circuit for providing the common logic signals that are used by both the individual score registers 22a and 22b of FIG. 2. The AND combination of A11 and B11 creates a DEUCE condition via gate 67, whose output is used to preset register 65 and render the END signal TRUE. The latter signal is needed for the display to distinguish between numerical scores 0-15-30-40, and the endgame scores DEUCE and AD. The same register 65 is cleared during a STROBE cycle by setting its J input to FALSE and permanently wiring its K input to TRUE. The J-K combination represented by binary 01 then forces the END output to FALSE.

Similarly, to create the logic state NEW, which records the fact that a game has been completed and is awaiting a new point or a CLEAR ENTRY command, the register 66 has its J input set to TRUE by either (A11 AND A) or (B11 AND B) via the OR gate 69. The K input of the same register 66 is set to FALSE normally, but goes TRUE when its own output is TRUE, and is thus self-clearing. The possible state changes are thus TRUE (JK=10) and FALSE (JK=01). Under normal operation, JK=00, and no change takes place, i.e., the NEW output remains FALSE. The remaining input condition, JK=11, will reset the NEW state to FALSE just as JK=01. A system CLEAR will preset the NEW register 66 to TRUE and blank the displays.

As with the individual registers, certain auxiliary logic signals are useful. SCORE•DEUCE will set the EXCHANGE output to TRUE and hence the DOWN output to TRUE unless the SCORE input is FALSE, via the action of AND gate 70 and EXCLUSIVE-OR gate 74. The same effect is derived via AND gate 71 by the values END•SCORE•GAME. The latter value is derived in OR gate 73. The combination NEW•_SCORE creates the logic state FIRST, to signify the beginning of a new game. Finally, DEUCE+NEW is derived in OR gate 75 and inhibits display of the left digit of the score in ENABLE L.

Figure 7:
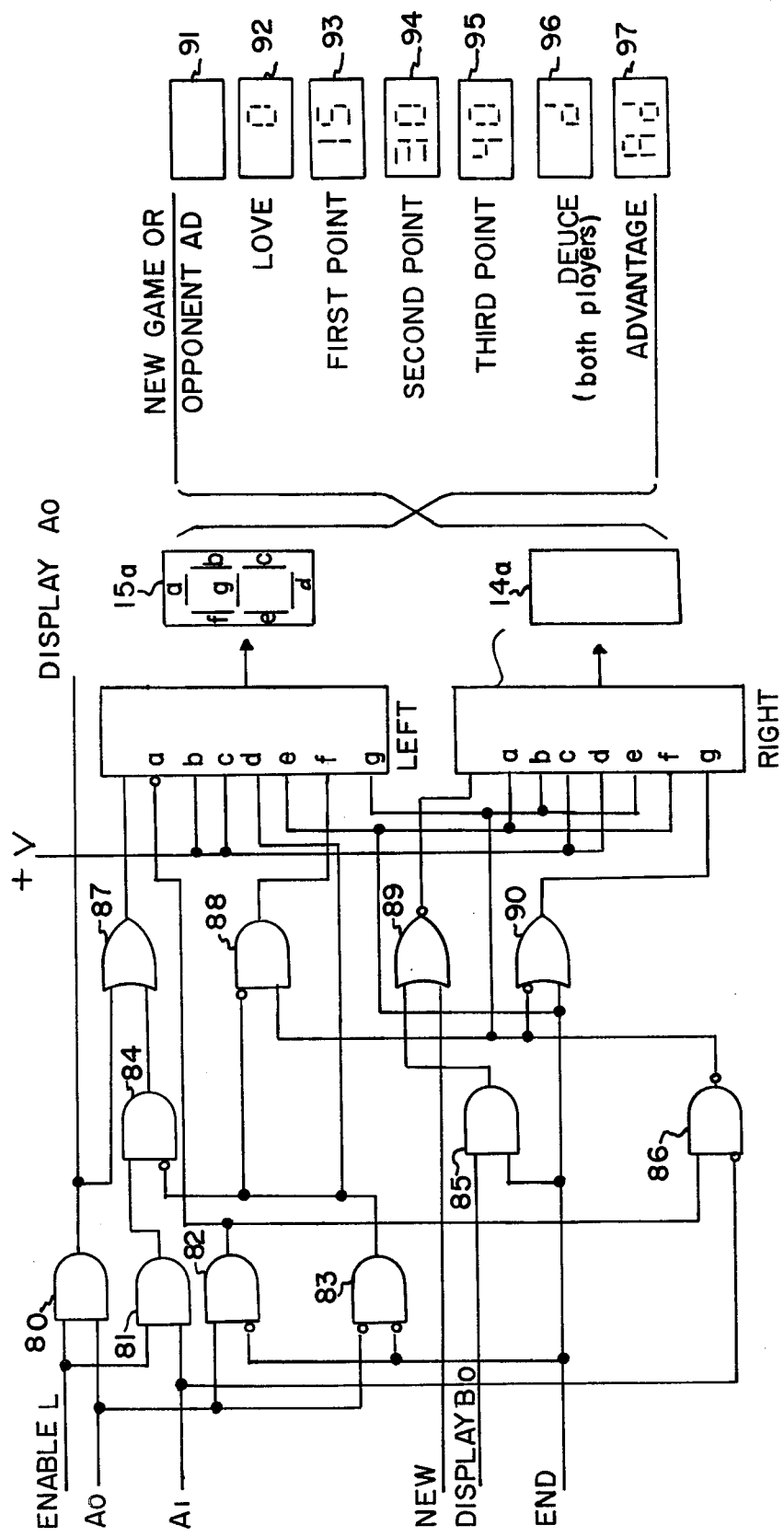
FIG. 7 is a logic diagram of a display decoder and game score display means of the present invention.

Referring now to FIG. 7, there is shown a circuit for decoding the game registers 50 and 51 of FIG. 5 and the auxiliary registers 65 and 66 of FIG. 6, plus their logical combinations and keyboard input signals, into a format suitable for display in a commonly available device such as a light-emitting diode (LED) or liquid crystal display (LCD) with seven segments. One of the principal features of the present invention is the encoding of a display of two or more digits using common circuitry, and the ability efficiently to create symbols for the DEUCE and ADVANTAGE conditions.

In FIG. 7, conventional symbology has been used for the seven segment displays 14a and 15a, namely that lower-case letters a through g denote the seven segments individually as shown on reference FIG. 15a. The action of the decoder, as embodied in gates 80 through 90, is best understood by reference to the following logic table:

| DIGIT | SEGMENT | CONDITION |
|---|---|---|
| LEFT | a = | $\overline{A0 \cdot \overline{END}}$ |
|  | b = | TRUE (always active) |
|  | c = | TRUE |
|  | d = | $\overline{A0 \cdot END}$ |
|  | e = | END |
|  | f = | $\overline{d \cdot g}$ |
|  | g = | $\overline{a \cdot \overline{A1}}$ |
| RIGHT | a = | e (LEFT) |
|  | b = | g (LEFT) |
|  | c = | TRUE |
|  | d = | TRUE |
|  | e = | b |
|  | f = | a |
|  | g = | $\overline{e}$ + END |

It will be understood that a TRUE condition on one of the display segments will cause the segment to become active, and will either illuminate or present a contrasting reflection, depending upon its construction. It is desirable to blank one or both the digits under some circumstances; each digit will become active for the following input conditions:

LEFT: [ENABLE L•A0]+]ENABLE L•A1•A0 •END]

RIGHT: NEW+[DISPLAY B0•END].

It will also be understood that the display circuitry is symmetrical for two players A and B, including the creation of DISPLAY A0 and DISPLAY B0 signals to be routed to the opponent's display encoder.

The resulting encoded signals are shown to the right of FIG. 7, including the all-blank condition (new game or opponent's advantage), the scores 0, 15, 30 and 40, and the derived alphabetic scores Ad and d, the latter being logically identical to Ad but with the left digit blanked. It will be observed that due to equalities within the logic table, only seven active lines are required for output; this means that an encoder similar in construction to a conventional seven-segment numeric display encoder could be built or created from a programmable logic array (PLA).

Figure 8:
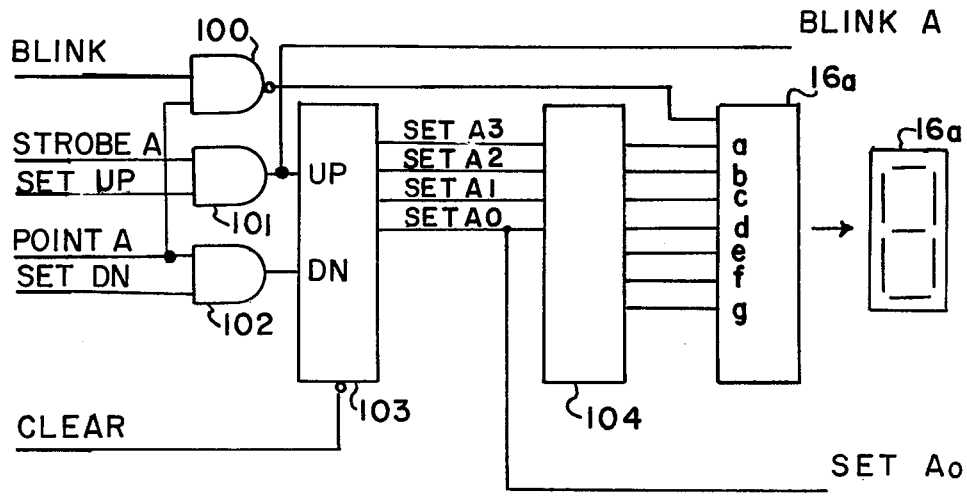
FIG. 8 is a logic diagram of circuitry for calculating and displaying set score of the present invention.

Referring now to FIG. 8, there is shown a preferred circuit for counting and displaying set scores, or the tally of games won. An up-down counter 103 is driven by the STROBE accompanying the player's own game score, and under normal operation will increment the set score whenever a new game is won, as identified by the logical input SET UP, to be described below. If a new game is followed by a CLEAR ENTRY, however, it is necessary to count down, and the combination of POINT A•SET DN accomplishes this via the AND gate 102. Counter 103 is in this preferred example a four-bit binary-coded decimal counter whose outputs SET A0 through SET A3 drive a BCD to seven-segment display encoder 104, such as is common in the art. The encoder 104 in turn drives a seven-segment numerical display device 16a, which creates the digits 0 through 9. A separate BLINK input causes the selected display to flash for a predetermined time interval after the winning game. The set score calculator and display of FIG. 8 is duplicated identically for players A and B, except for the naming of logic signals.

Figure 9:
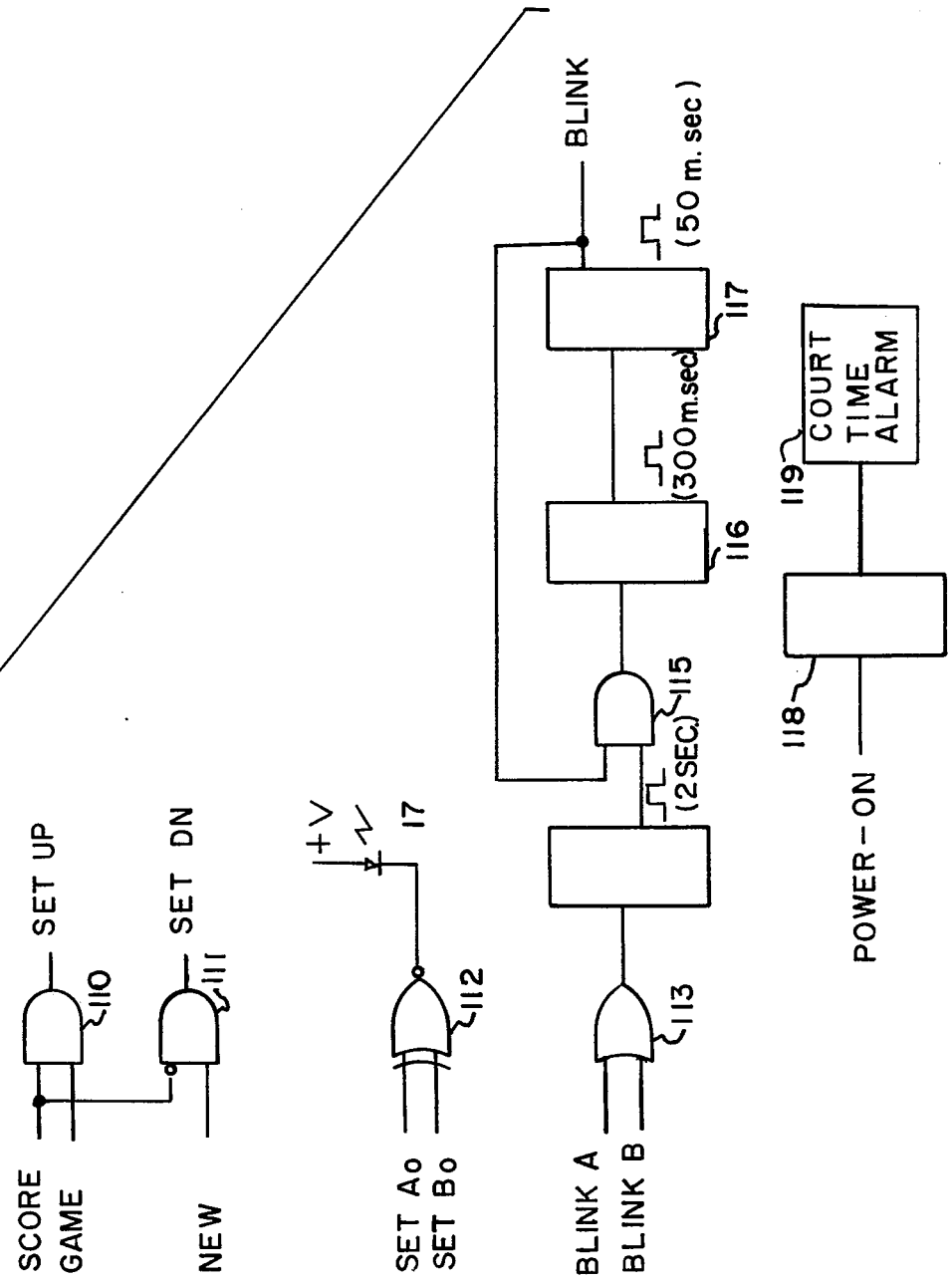
FIG. 9 is a logic diagram of circuits common to the set score calculation and display for two players.

Referring now to FIG. 9, there are shown preferred circuits for commonly creating the logic signals necessary to drive the individual set score registers. The logical ouput SET UP used in FIG. 8 is created by the AND gate 110 using SCORE and GAME as its inputs. Similarly, NOT SCORE and NEW are combined in AND gate 111 to create the output SET DN.

EXCLUSIVE-OR gate 112 determines that the gross set scores are odd or even as represented by their low-order bits SET A0 and SET B0, and activates a COURT CHANGE INDICATOR 17, shown here as a LED indicator.

Monostable timers 114, 116 and 117 act to flash the winner's set score display upon receipt of a trigger BLINK A or BLINK B from the individual set score registers. Timer 114, driven by OR gate 113, will start the flashing and keep it active for a period of time (approximately two seconds is preferred), and the timers 116 and 117 alternately turn the display on and off, via the output called BLINK, which is combined with the most recent point signal (POINT A of FIG. 8) to flash the appropriate display. Finally, timer 118 as set to start timing when power is applied to the entire device, and to activate a visual or aural alarm 119 after a preset time limit. For tennis, a one-hour time limit is frequently applied to the use of shared courts, and is preferred for the present embodiment. While a specific embodiment of the invention has been described, it will be realized by those skilled in the art that various changes may be made therein without departing from the spirit or intent of the inventive concept. Therefore, it is intended that the scope of the present invention be delimited only by the claims appended below.

We claim the following:

1. A device for calculating, storing and displaying the scores for tennis and similarly-scored games, comprising:
   data entry means,
   one bidirectional counter for each player for storing score results, wherein said bidirectional counter is responsive to said data entry means and to encoder means, and wherein said bidirectional counter counts in one direction for normal scoring situations, and counts in the opposite direction for special scoring situations and for returning to the immediately prior value of said score results,
   encoder means responsive to said bidirectional counter and to said data entry means for providing command data to determine subsequent contents of said bidirectional counter, wherein said encoder means recognizes a condition in which a special scoring mode must be invoked, and
   indicator means responsive to said bidirectional counter, for indicating said score results.

2. The scorekeeping device as set forth in claim 1, wherein said encoder means includes means responsive to said data entry means for causing said score results to be restored to their immediately prior values.

3. The scorekeeping device as set forth in claim 1, wherein said indicator means comprises:
   display encoder means and
   seven-segment display means responsive to outputs from said display encoder means.

4. The scorekeeping device as set forth in claim 1 including set register means responsive to said game register means and to said data entry means for tallying the scores of games won.

5. The scorekeeping device as set forth in claim 4, wherein said set display means includes flasher means responsive to said set register means for indicating the winning of a new game.

6. The scorekeeping device as set forth in claim 4, including court change indicator means responsive to said set register means for indicating a condition dependent upon the number of games played.

7. The scorekeeping device as set forth in claim 1, including timing means and time limit indicator means.

8. The scorekeeping device as set forth in claim 1, in combination with clock means for calculating time of day, and indicator means responsive to said clock means for indicating time of day.

9. A device for calculating, storing and displaying the scores of tennis and similarly-scored games, comprising:
   data entry means,
   game register means for storing score results, said game register means comprising one bidirectional counter for each player, said bidirectional counter having a capacity equal to a maximum attainable score, and said bidirectional counter being responsive to said data entry means and to encoder means,
   encoder means responsive to said game register means and to said data entry means for providing command data to determine subsequent contents of said game register means, wherein said encoder means recognizes a condition in which a special scoring situation must be invoked, and wherein said encoder means comprises non-volatile memory means, and
   indicator means responsive to said game register means for indicating said score results.

10. A device for calculating, storing and displaying the scores of tennis and similarly-scored games, comprising:
   data entry means,
   game register means for storing score results, said game register means comprising one bidirectional counter for each player, said bidirectional counter having a capacity equal to a maximum attainable score, said bidirectional counter being responsive to said data entry means and to encoder means, and wherein said bidirectional counter comprises:
   logic gate means responsive to the output of said bidirectional counter and to said data entry means for deriving counter command signals, and J-K bistable latch means responsive to said counter command signals for incrementing or decrementing a binary count, encoder means responsive to said game register means and to said
   data entry means for providing command data to determine subsequent contents of said game register means, wherein said encoder means recognizes a condition in which a special scoring situation must be invoked, and
   indicator means responsive to said game register means for indicating said score results.

* * * * *